United States Patent [19]

Friedman et al.

[11] Patent Number: 5,027,376

[45] Date of Patent: * Jun. 25, 1991

[54] DATA TELECOMMUNICATIONS SYSTEM AND METHOD FOR TRANSMITTING COMPRESSED DATA

[75] Inventors: Paul Friedman, Westwood; Nathan Melhorn, Framingham, both of Mass.

[73] Assignee: Microcom Systems, Inc., Wilmington, Del.

[*] Notice: The portion of the term of this patent subsequent to May 31, 2005 has been disclaimed.

[21] Appl. No.: 200,626

[22] Filed: May 31, 1988

Related U.S. Application Data

[63] Continuation of Ser. No. 793,581, Oct. 30, 1985, Pat. No. 4,748,638.

[51] Int. Cl.$^5$ .............................................. H04B 1/66
[52] U.S. Cl. ...................................... 375/122; 341/65; 381/31
[58] Field of Search ........................ 341/65, 106, 107; 358/133, 138, 261.1, 261.4; 382/56; 370/118; 381/29, 31; 375/122

[56] References Cited

U.S. PATENT DOCUMENTS

| | | | |
|---|---|---|---|
| 3,675,211 | 7/1972 | Raviv | 341/106 |
| 3,675,212 | 7/1972 | Raviv et al. | 341/106 |
| 4,044,347 | 8/1977 | Van Voorhis | 341/106 |
| 4,121,259 | 10/1978 | Pruess et al. | 358/261.1 |
| 4,396,906 | 8/1983 | Weaver | 341/65 |
| 4,516,246 | 5/1985 | Kenemuth | 375/122 |
| 4,546,342 | 10/1985 | Weaver et al. | 375/122 |
| 4,646,061 | 2/1987 | Bledsoe | 341/65 |

*Primary Examiner*—Benedict V. Safourek
*Attorney, Agent, or Firm*—Gaston & Snow

[57] ABSTRACT

Disclosed is a data compressing modem for connection to a decompressing modem over communication lines. The compressing modem receives an input data stream, and each character in the data stream is recodified with a compressed character code, the length of which is dependent on the frequency of the character in the data stream. A frequency table is maintained so that changes in the relative frequency of characters in the data stream will be recognized by the compressing modem and the compressed character codes representing such characters will be exchanged accordingly. A decompressing modem, which is connected over communication lines to the compressing modem, processes the compressed character code in a reverse order from the manner in which the compresing modem processing the codes. The decompressing modem also maintains a relative frequency table and as the relative frequencies of the various characters change, the actual characters represented by the compression codes must also change.

9 Claims, 8 Drawing Sheets

DATA TELECOMMUNICATIONS SYSTEM AND METHOD FOR TRANSMITTING COMPRESSED DATA

CROSS REFERENCE TO RELATED APPLICATION

This application is a continuation application of Ser. No. 793,581, filed Oct. 30, 1985, and now U.S. Pat. No. 4,748,638, issued on May 31, 1988.

BACKGROUND OF THE INVENTION

This invention relates generally to a data telecommunications system, and more particularly to a system including modems that compress data transmitted between two microcomputers over communication lines.

Whereas microcomputers were once only used as dedicated and completely isolated devices, they are now used for a wide range of applications, many of which require microcomputers to communicate with each other. Problems develop with such communication because of the existence of a wide variety of microcomputers which are incapable of directly communicating with each other. As a result, many data communication systems for microcomputers force the microcomputer to work principally as a dumb terminal for a remote mini- or mainframe computer. Therefore, to facilitate more sophisticated communication, communication protocols which enable data communications between a wide range of computers, from low end microprocessors to large mainframes, have been developed. The proliferation of protocols, however, not to mention operating systems and microprocessors, has for the most part precluded the adoption of a standard file transfer method.

A communication protocol is basically a set of rules that defines how the computers interact. For two computers to transfer a file successfully, they must observe the same protocol. Typically, a protocol specifies when to send a message, how to format the information in the message, and at the other end, how to acknowledge the receipt of the message.

Simple physical connect protocols are concerned only with hardware configurations. Establishing the basic physical connection between two computers requires that a particular series of steps be followed. The originating modem initiates its sending sequence, and the telephone number representing the receiving modem's electronic address is formatted as a series of pulses or tones and sent into the telephone network. The receiving modem senses the incoming call as a relatively high voltage (sufficient to cause a phone to ring) and interprets this as a request to establish a connection. If the connection is established, an acknowledgement message sent to the transmitting modem thereby establishes the connection. Such a physical link is capable of being established because both modems use the same protocol. These basic connect protocols are fairly standard, particularly for the low speed, asynchronous modems commonly used with microcomputers, such as Bell 103 and 212A modems. However, as communications become more complex and involve dissimilar machines and file formats, the protocols must, in turn, become increasingly sophisticated.

Connecting two computers is only a small part of the communications work necessary for accurate data transfer. Telephone lines are often noisy, and errors can crop up in the transmitted data. These errors must be detected and corrected. The resources available to store incoming data must also be passed and matched so that the recipient is not flooded with data. Also, information regarding the computer file system must be swapped and file movement and manipulation must be defined. These concerns, therefore, go beyond the physical-level protocols into the realm of complex communications protocols.

One protocol which enables complex communications between microcomputers is the Microcom Networking Protocol (MNP) which has been developed by Microcom Corporation of Norwood, Mass., the assignee of the present application. MNP provides a sophisticated communications system which includes provisions for both reliable terminal-type communications and reliable file transfer in a manner which can reasonably be implemented on a wide range of computers. MNP accounts not only for hardware and operating systems differences, but also provides sophisticated error checking. As a result, file exchanges are thus possible between almost any computers using an MNP based communication system.

The MNP protocol, which has been developed principally for use with microcomputers, includes three layers, and the use of only three layers enables MNP to provide the necessary services with the desired space and performance characteristics for a microcomputer environment. The three layers or modules are combined to perform a series of complex functions in a manner in which changes in one module may not drastically affect another module, as long as certain parts of the module's interface remain the same.

In MNP, each layer is relatively isolated and provides a specific service. If a change is forced in one layer (for example, if MNP is modified for use on a new computer), the change is confined to that layer while the layer's standard interface to the other layers remains unchanged. In addition to ensuring machine portability, MNP's structure allows services provided by one layer to support those in the layer above. The accumulation of services is then passed upward, from layer to layer to the applications program. MNP defines three unique protocol layers in addition to the physical connection: the link, the session, and the file protocol layers. The protocol layers are triggered sequentially from the bottom (physical) to the top (file transfer).

The link layer is responsible for providing reliable, controlled data transmission over a medium that is inherently noisy and likely to cause errors. Once a physical connection is established between two machines, the link protocol acts as a negotiator causing both computers to agree on the nature of the link. For example, the link protocol establishes whether the connection will be half- or full-duplex, how many data messages can be sent before confirmation is required, the size of a single data packet, etc. After establishing values for the above requirements, the link protocol initiates data transfer, paces the flow of data and, if necessary, retransmits data messages that contain errors due to telephone line noise. The link protocol allows blocks or packets of data (as opposed to individual bytes) to be sent synchronously or asynchronously to the receiving computer. Data transfer is faster when packets are transmitted synchronously because start and stop characters are not needed, and as a result the ratio of data to control characters regulating the transfer is higher. Control is possible because of a mainframe-like (framing) technique in which a block of data is carried from both ends with specific codes.

The session layer negotiates with the receiving computer with respect to the pertinent system and file information including computer type, how files are formatted, the type of information transmitted (e.g. ASCII, binary) and the user's identity. This layer also provides the automatic negotiation of which level of service can be used between the two communicating devices.

The file transfer layer defines and formats the messages involved in file transfers and manipulations. There are three transfer services available: one allowing the sending of a file, the second allowing the receipt of a file, and the third allowing the appending of a file to an existing file at the other end of the communications link. The file transfer protocol also enables the manipulation of distant computer files. For example, such files can be deleted, renamed or file directories may be displayed. A typical file transfer starts when one computer sends a "file start" message to the other computer. The file start message includes the requested files name, size and format along with any password needed for the files return trip to the requesting computer. Both computers exchange "hellos" along with a confirmation that a file will be soon filed by one side and accepted by the other.

In order for any communications protocol to facilitate communications among wide variety of computers, the protocol must be able to operate in a number of modes. These modes include a matched-protocol mode for use by two communicating devices supporting the same protocol. Such a matched-protocol mode may provide optimized data transmission including any of a number of known optimizing features such as detecting and correcting errors, optimizing transmission speed, etc. A second mode which allows straight forward data transmission (without any optimizing features) between two communicating systems must also be provided. The operating mode is generally negotiated in a lower link layer, and in MNP the mode is selected in the link layer.

A modem operating under the MNP protocol discussed above has four basic modes: reliable mode, normal mode, auto-reliable mode, and direct mode. The reliable mode is the basic matched-protocol mode of MNP which provides error detection and automatic retransmission of data when an error occurs in order to ensure that communications between two communicating systems are error-free. In order to utilize this reliable mode, however, both of the communicating modems must be able to support this mode. A second mode, MNP's normal mode, allows a modem with MNP to communicate with a modem not supporting this protocol. MNP's auto-reliable mode is an extension of the reliable mode which will automatically connect two modems in a reliable mode if such a connection is possible. In other words, if both of the communicating modems can support MNP, a reliable, error-correcting connection is established. The auto-reliable mode differs from the reliable mode insofar as the modem in the auto-reliable mode initially looks for incoming MNP protocol characters from the remote modem. If, after a predetermined amount of time has expired, these MNP characters are not detected a normal link is established. If these characters are detected, a reliable link is established. A fourth mode, the direct mode, is used for special purpose formats or character sets, and the modem buffers and flow control command settings are ignored.

Modems generally have two data ports—a serial port and a modem port. The serial port is connected to a computer or terminal, and the modem exchanges data with the local computer (the computer to which it is directly directed) through the serial port. The modem port is for the connection to the telephone line, and the modem exchanges data with a remote modem over telephone lines through the modem port.

Known modems can receive and transmit data over the serial port at a speed different from that of the modem port. Flow control allows the modem to control the data stream in either directions, and such flow control is necessary when data is received at a faster rate than it is sent whether this faster rate is due to different modem and serial port speeds or whether it is due to delays during error correction.

One method of performing flow control for a modem is to provide character buffers for each direction of data flow. If the serial port is operating at a greater speed than the modem port, the modem buffer will fill to capacity. As long as the computer or terminal attached to the serial port of the modem supports flow control, there is no loss of data when the buffer fills. To avoid such overflow of buffers, a flow controller of a modem has the ability to turn on and off the flow of information between transmitting computers. In order for modem flow control to be effective, the computer or terminal device to which it is connected must also support flow control. Otherwise, the serial port should not be operated at a speed greater that the actual connection speed. In order to use an optimizing protocol such flow control is necessary.

While flow control and the reduced number of protocol levels allow MNP to efficiently and quickly send data files from one microcomputer over telephone lines, several problems still remain. For one, it is almost always desirable to send data at a higher rate. The addition of error correcting and virtual file storage to a protocol type described above, further slow the speed of data from one computer to another. Also, while a computer can provide data to a modem at a high speed, the modems are frequently restricted as to the speed at which it can send data over the telephone lines.

It is therefore a principal object of the present invention to provide a data telecommunications system and method for transmitting data at very high speeds.

It is a further object of the present invention to provide a data telecommunications system which can provide for higher data rates than that otherwise possible with the modems being utilized.

Another object of the present invention is to send data characters between communicating microcomputers in a compressed form.

Yet another object of the present invention is to send data characters between communicating microcomputers in a compressed form with the compression taking place in real time.

SUMMARY OF THE INVENTION

According to the present invention, a data compressing modem is provided for connection to a decompressing modem over communication lines. The compressing modem receives an input data stream, and each character in the data stream is recodified with a compressed character code, the length of which is dependent on the frequency of the character in the data stream. Each compressed character code includes three header bits and one to seven data bits. A frequency table is maintained so that changes in the relative frequency of characters in the data stream will be recognized by the compressing modem and the compressed character codes representing such characters will be exchanged accordingly.

A decompressing modem, which is connected over communication lines to the compressing modem, processes the compressed character code in a reverse order from the manner in which the compressing modem processes the codes. The decompressing modem must therefore maintain a relative frequency table and as the relative frequencies of the various characters change, the actual characters represented by the compression codes must also change.

In an alternate embodiment of the present invention, runs of repeated characters may be detected and transmitted by just a token indicating the number of characters in the run. To avoid the necessity of creating additional characters, the compressing modem of the present invention uses a compressed character code to indicate the number of characters in a run.

These and other objects and features of the present invention will be more fully understood from the following detailed description which should be read in light of the accompanying drawings in which corresponding reference numerals refer to corresponding parts throughout the several views.

Appendix A is a listing of computer instructions for enabling the system of the present invention to compress and decompress data.

DETAILED DESCRIPTION OF THE PREFERRED EMBODIMENT

Figure 1:
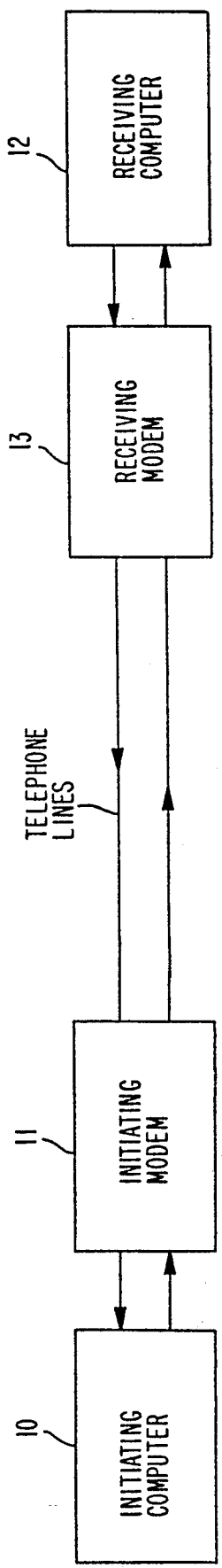
FIG. 1 is a generalized block diagram of a data telecommunications system.

A basic data telecommunications system, shown in FIG. 1 includes an initiating unit of data terminal equipment 10, which may be either a dumb terminal of a microcomputer, and a receiving unit of data terminal equipment (DTE) 12. An initiating modulator/demodulator (modem) 11 is connected between unit 10 and telephone lines, and a receiving modem 13 is connected between unit 12 and telephone lines.

Figure 2:
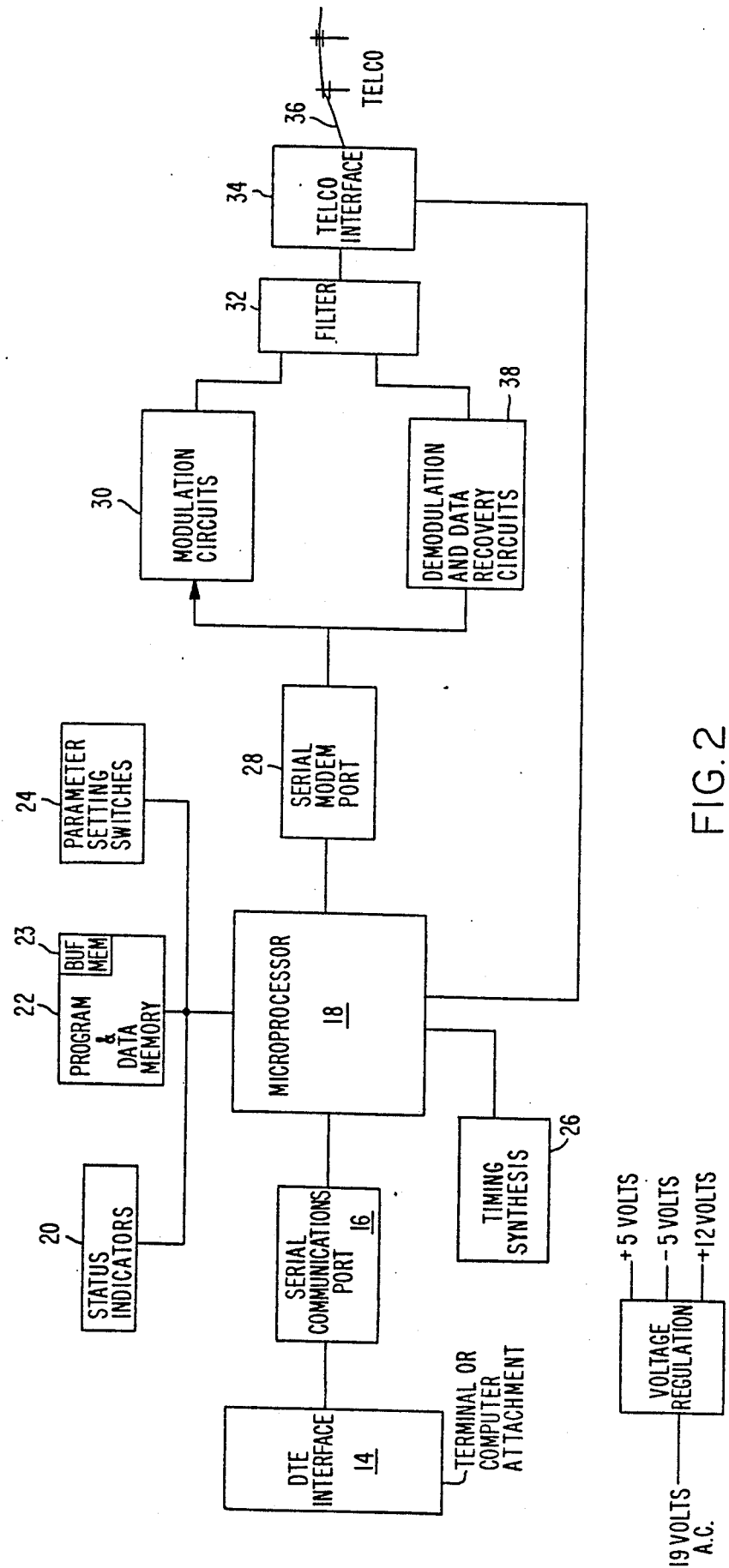
FIG. 2 is a block diagram of the components of a modem of the present invention.

A modem of the communication system of the present invention is shown in FIG. 2. While the system of the present invention will include at least one modem of the type described below, it is preferable that both modems be of this type. For purposes of the following discussion, the modem of the system will be described with reference to modem 13. The modem 13 includes a DTE-interface 14 which receives data coming from DTE unit 12. Data characters supplied to the DTE-interface 14 pass through a serial communications port 16 of the microprocessor 18 to which characters are fed in a serial fashion. The microprocessor 18 has connected to it status indicators 20, a program and data memory 22 and parameter setting switches 24. Timing synthesizing circuitry 26 is also connected to the microprocessor 18. Data processed by the microprocessor 18 is sent through a serial modem port 28 to modulation circuits 30 which will pass data on through a filter 32 to a telephone interface 34 and then onto telephone lines over which the data will be transmitted to another microcomputer. The modem 13 also includes demodulation and data recovery circuits 38 which are used for receiving data from another remotely situated modem, such as modem 11. When the modem 13 acts as a receiving modem, data passes through the same elements discussed above in a reverse order following the passage of data through the demodulation and data recovery circuits 38.

In order to speed the travel of data from one microcomputer to another over telephone lines, the communication system of the present invention reduces the amount of data being sent over the telephone lines by compressing the data into a reduced number of data characters. In essence, the data compression involves the reduction of the number of information units (in this case bits) necessary to represent a data stream. In the present invention, each item of data in a data stream is recodified in a manner in which the most frequently transmitted characters are represented by codes comprising fewer bits than codes representing less frequently occurring characters.

For 8-bit computer data, there are 256 different characters which must be mapped onto 256 different codes. When leading zeros are removed, there are 128 characters which have fewer than 8 bits. The present invention makes use of this fact by representing the more frequently occurring data characters with codes having leading 0's removed. In order to separate such recodified data characters from each other, header bits are provided to indicate the length of new compressed character codes. Since 3 bits are needed to indicate a length up to 8 bits, the present invention utilizes 3 header bits followed by 1 to 7 data bits representing the data character. The new variable length compressed character codes are therefore made up of 4 to 10 bits with the nth shortest compressed character code representing the nth most frequently occurring data characters. Since the leading 0's of each compressed character code are removed to represent a data character with 1 to 8 bits, each data part of more than 1 bit of a compressed character code will begin with a 1. Therefore, in order to fit up to 8 bits in 7-bit locations, the leading 1 (which is always the first bit) is removed from each compressed character code having a data part with more than 1 bit.

Figure 3A:
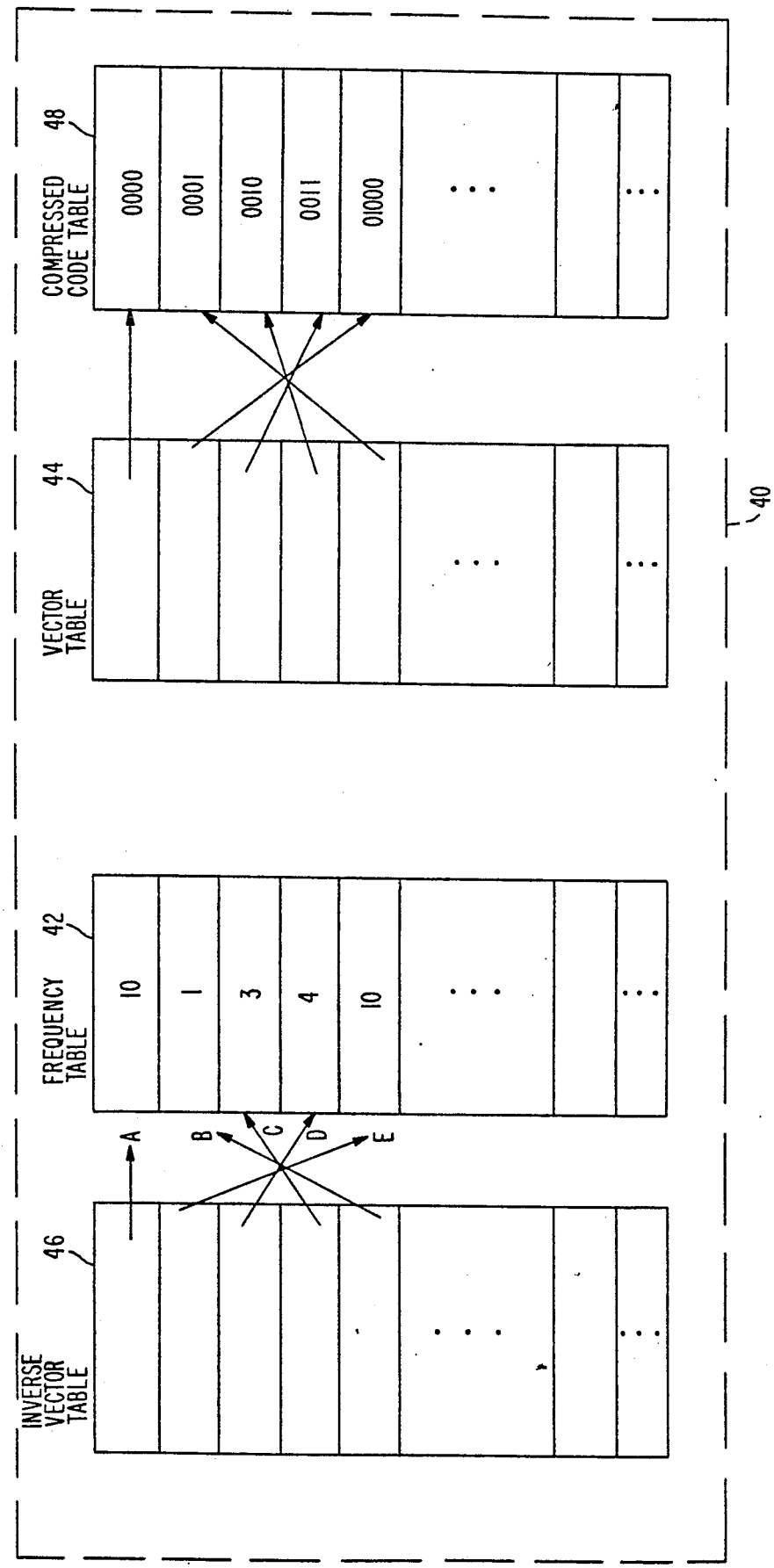
FIGS. 3(a) and 3(b) are representative views of the memory tables utilized by the compressing modem and the decompressing modem of the present invention respectively.
Figure 3B:
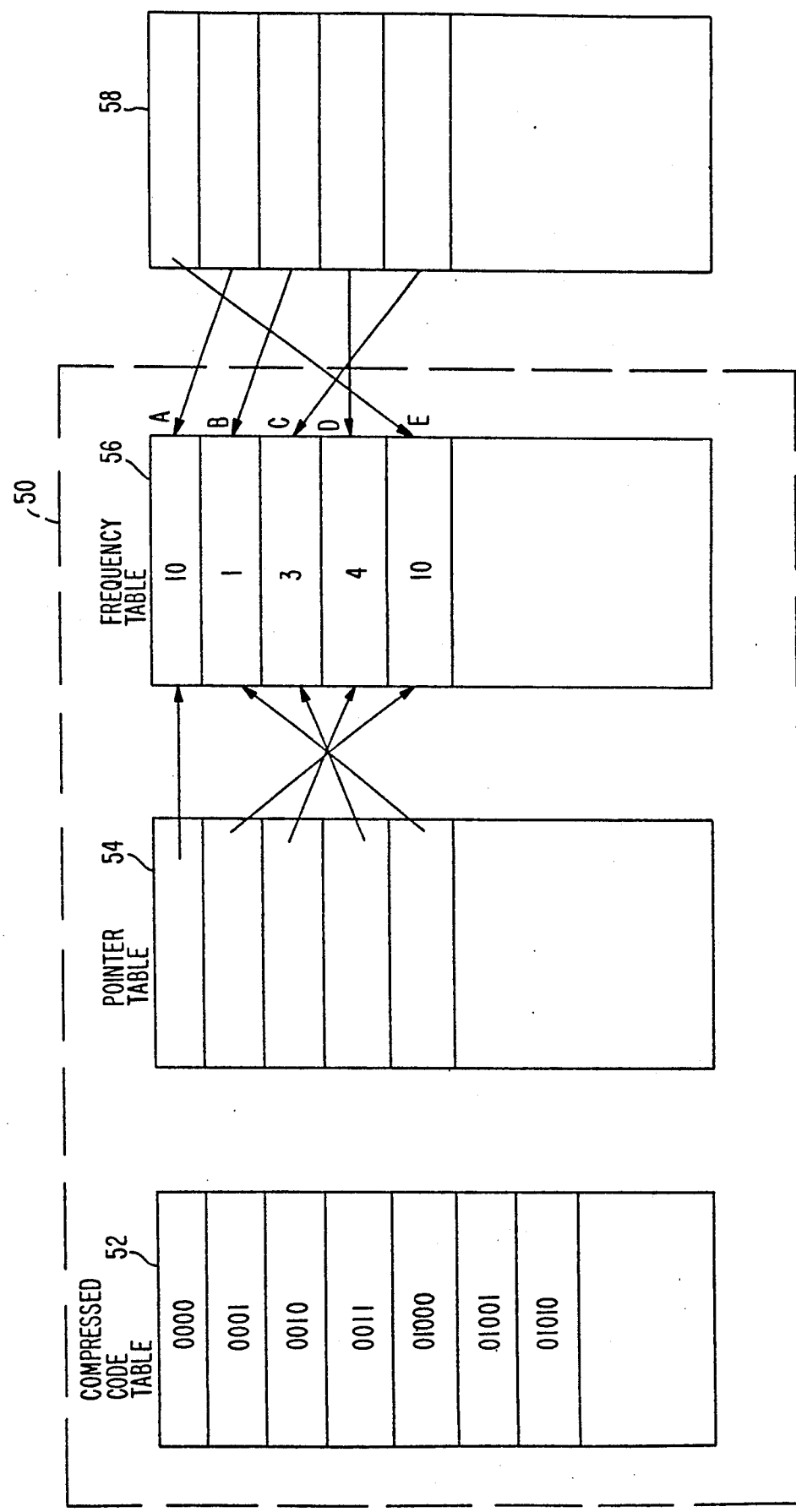

The data telecommunications system of the present invention includes both a compressing modem (compressor) for compressing data sent by the initiating unit; and a decompressing modem (decompressor) for decompressing data transmitted to a receiving unit. Referring to FIG. 3, the compressor utilizes a memory 40 which includes four tables: a frequency table 42, a compressed character code pointer table 44, an inverse compressed character code pointer table 46 and a compressed character code table 48. The frequency table includes a position for each of the 256 possible data characters. These characters are arranged in a fashion which will enable a fast look-up, and in a preferred embodiment the characters are ordered numerically by their 8-bit data character codes. The compressed character code pointer table 44 is a table of pointers which includes a pointer for each location in the frequency table which points to the compressed character code for each corresponding character and is ordered by the 8-bit character codes. The inverse compressed character code pointer table 46 also includes 256 pointers, each of which is the inverse of the corresponding pointer in the compressed character code pointer table 44. In other words, each pointer of the inverse pointer table 46 from each code points to a corresponding location in the frequency table 42. Finally, the compressed character code table 48 includes the 256 compressed character codes which can be used by each of the 256 characters. The compressed character code table 48 is arranged in numerical order of the compressed character codes, and in effect, the compressed character code table is ordered according to the length of the codes.

Figure 4A:
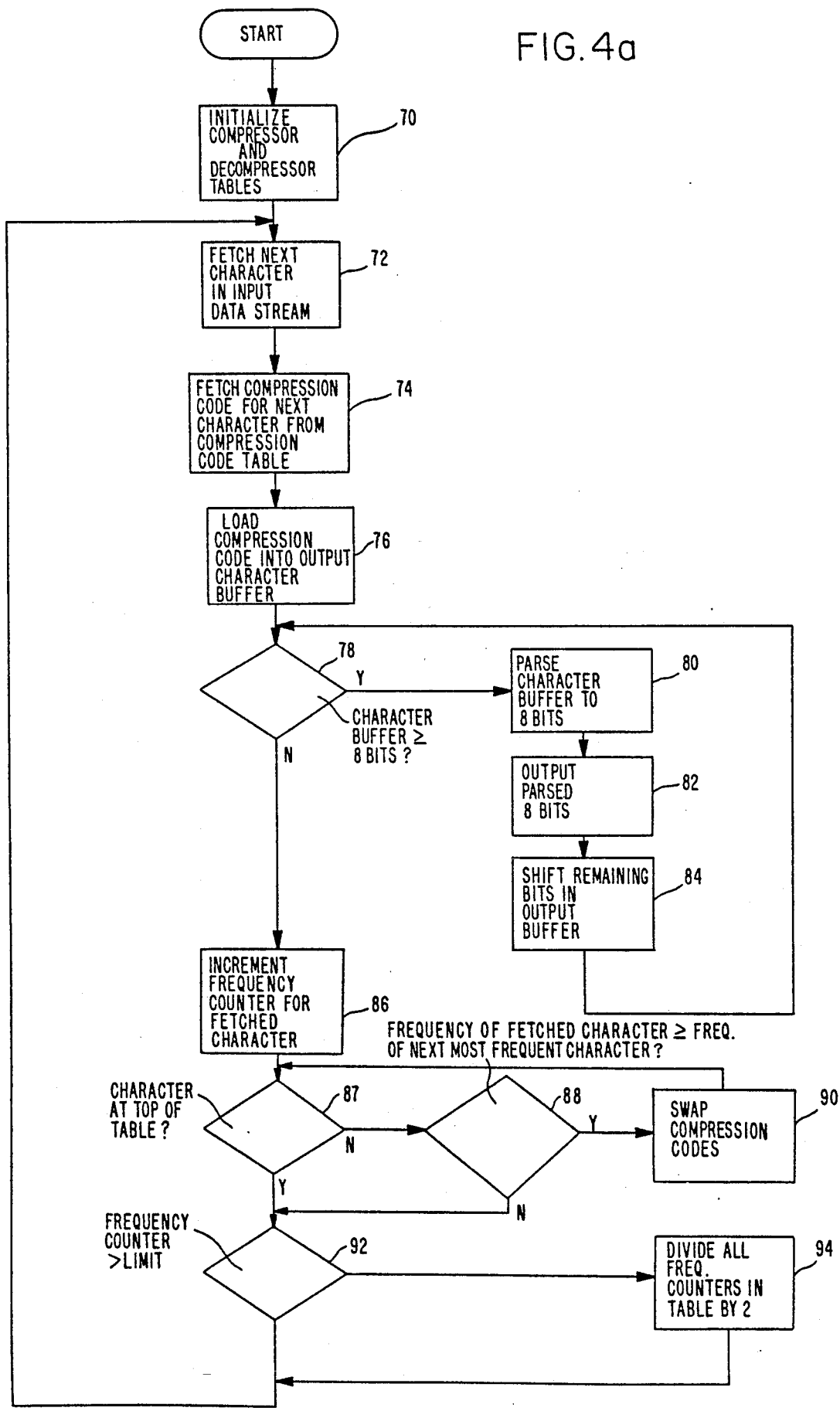
FIG. 4(a) is a flow diagram of the process used by the compressing modem for compressing data characters.
Figure 4B:
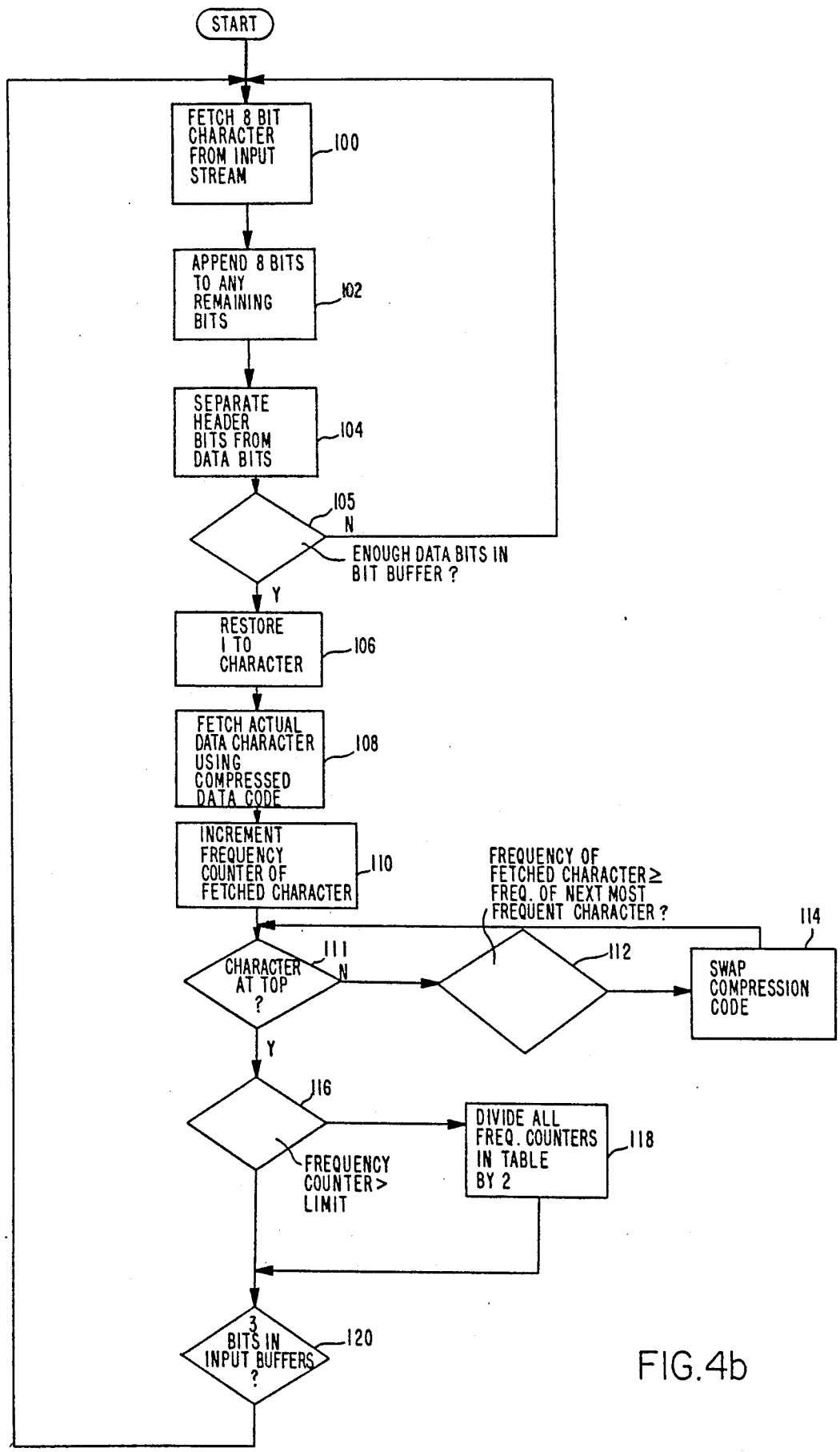
FIG. 4(b) is a flow diagram of the steps utilized by the receiving modem of the present invention to decompress the compressed character codes received from a compressing modem of the present invention.

Referring to FIGS. 4(a) and 4(b) compression begins with the initialization of the tables in step 70. First, the frequency counters in both the compressor frequency table 42 and the decompressor frequency table 52 are set to zero. The initial relative frequencies for each of the characters for both the compressor and decompressor are loaded from a permanent table 58 which is based on some global counts of character frequencies. In one embodiment, there may exist several permanent tables which are selected on the basis of the type of data being transmitted. Failure to utilize such predetermined frequency tables will only result in an initial slowdown of the character compressing since the appropriate relative frequencies will sort the compression codes to provide optimum operation in a short time following startup.

The pointer table 44 is filled with pointers mapping each character in the frequency table 42 to a compressed character code with the mapping of each data character being based upon the initial relative frequency of each character in the table. The inverse pointer table 46 is filled with pointers that are the inverse of the pointers in the first pointer table 44, and these pointers are used to facilitate sorting during the compression stages. In the decompressor, the pointer table 54 is initialized to map the compressed character codes to the actual data character codes according to the initial relative frequency table. The mapping of this table is identical to the inverse pointer table 46.

The system of the present invention compresses characters in the following manner. The first character in the data stream is read in step 72, and the compressed character code associated with the character is the fetched in step 74. To locate the proper compressed character code, the compressor finds the location of the input data character in the pointer table 44. The pointer in the corresponding location which points to the proper compressed character code, is then used to fetch the compressed character code. The fetched compressed character code is loaded into a 16-bit (two byte) buffer and appended to any bits left over in the buffer from the previous compressed code in step 76. If there are at least 8 bits in this 16 bit buffer step 78 causes the codes in the buffer to be parsed to multiples of 8 bits in step 80 and transmitted to the decompressing modem in step 82. Any bits left over are shifted in step 84 so that the buffer acts as a queue for use by the next compressed character code transmission. The order of the compressed data in the output stream is thus preserved.

After the data character being compressed is utilized for locating the pointer for its compressed character code, the relative frequency counter for that character in the frequency table 42 is incremented in step 86. After examining the pointer which was used to fetch the compressed character code, if the character is determined in step 87 to be the most frequent character, the sorting ends, and control of the system jumps to step 92. The relative frequecy of this data character is compared in step 88 with the frequency of the next more frequently occurring character in the input data stream. The comparison is accomplished by using the table locations of the compressed character code of the input or current data character and the compressed character code immediately preceeding the code of the input data character in the compressed character code table 48. These locations are then used to fetch the pointers in the corresponding locations of the inverse pointer table 46, and these pointers are then used to fetch the relative frequencies of the two data characters represented by the two compressed character codes. If the frequency of the current character is greater than or equal to the frequency of the next more frequently occurring character, the compression codes of the current character and the next most frequently occurring character are exchanged in step 90 by exchanging the pointers in both pointer tables 44, 46 for both characters. The frequency of the current character is then compared to the character which is now the next more frequently occurring character in the input data stream, and if the frequency of the current character is greater than or equal to the next more frequently occurring character and the character is not now the most frequent character, the compressed character codes are once again swapped. The cycle of steps 88 and 90 continues to iterate until no more swaps are needed at which time the frequency table is sorted accurately.

Once the frequency table is sorted, the frequency counter of the current character is compared to a fixed limit value for the counter in step 92, and if this limit value is exceeded, all of the frequencies in the table are divided by two in step 94. Dividing the frequency counters by two weighs the present data over the past data and preserves the relative relationships of the data. At this point, the compressor is ready for the next character in the input data stream which is fetched in step 72.

The compressed data codes which are received by the receiving modem are processed by the decompressor. The decompressor fetches a byte from the input data stream in step 100. The 8 bits are appended to any bits remaining in a character buffer used for storing incoming compressed code carrying bytes in step 102. The header bits are then separated from the data bits of the next compressed character code in the character buffer in step 104. The header bits are then read and compared in step 105 to the length (in bits) of the character buffer in order to determine if there are enough bits to make up the data portion of the code. If there are not enough bits, the next byte is fetched from the input stream and appended to the character buffer. In step 106, a 1 is restored to the front of the compressed character code (except if the header is 0) to make up for the 1 deleted in the compression stage.

Using the compressed character code expanded to 8 bits, the actual data character is fetched in step 108 by looking up the code in the corresponding location of pointer table 54. The fetched pointer points to the actual character in frequency table 56 which the compressed character code represents. In step 110 a frequency counter for the fetched character is incremented. By using the 8 bit expanded compressed code, if the actual character is determined in step 111 to be the most frequent character in the decompression modem, the sorting ends, and control of the system jumps to step 116. The frequency of the fetched character is then compared to the frequency of the next more frequently occurring character in the data stream in step 112 by looking up the code in the compressed character code table 52 in the location just before the current code. The pointer in the location of table 54 corresponding to this code is used to obtain the frequency of the next more frequent character. If the frequency of the fetched character is greater than or equal to the frequency of the next more frequently occurring character and the character is not the most frequent character, then the compressed character codes for the two compared characters are exchanged in step 114 by the exchange of the pointers in table 54. The frequency of the fetched character is then compared to the frequency of a new next more frequently occurring character, and if necessary, another swap of the compressed character codes takes place. The iteration of the loop involving steps 111, 112 and 114 continues until no more swaps are necessary or until the character is the most frequent, and the relative frequency table of the decompressor is thereby sorted.

The frequency counter of the fetched character is then compared to a preset limit value in step 116, and if this preset limit is exceeded, all of the frequency counters in the table are divided by two in step 118. If there are more than 3 bits in the input buffer, the decompressor jumps to step 104, if not, the decompressor is now ready to process the next compressed character code in step 100.

Figure 5A:
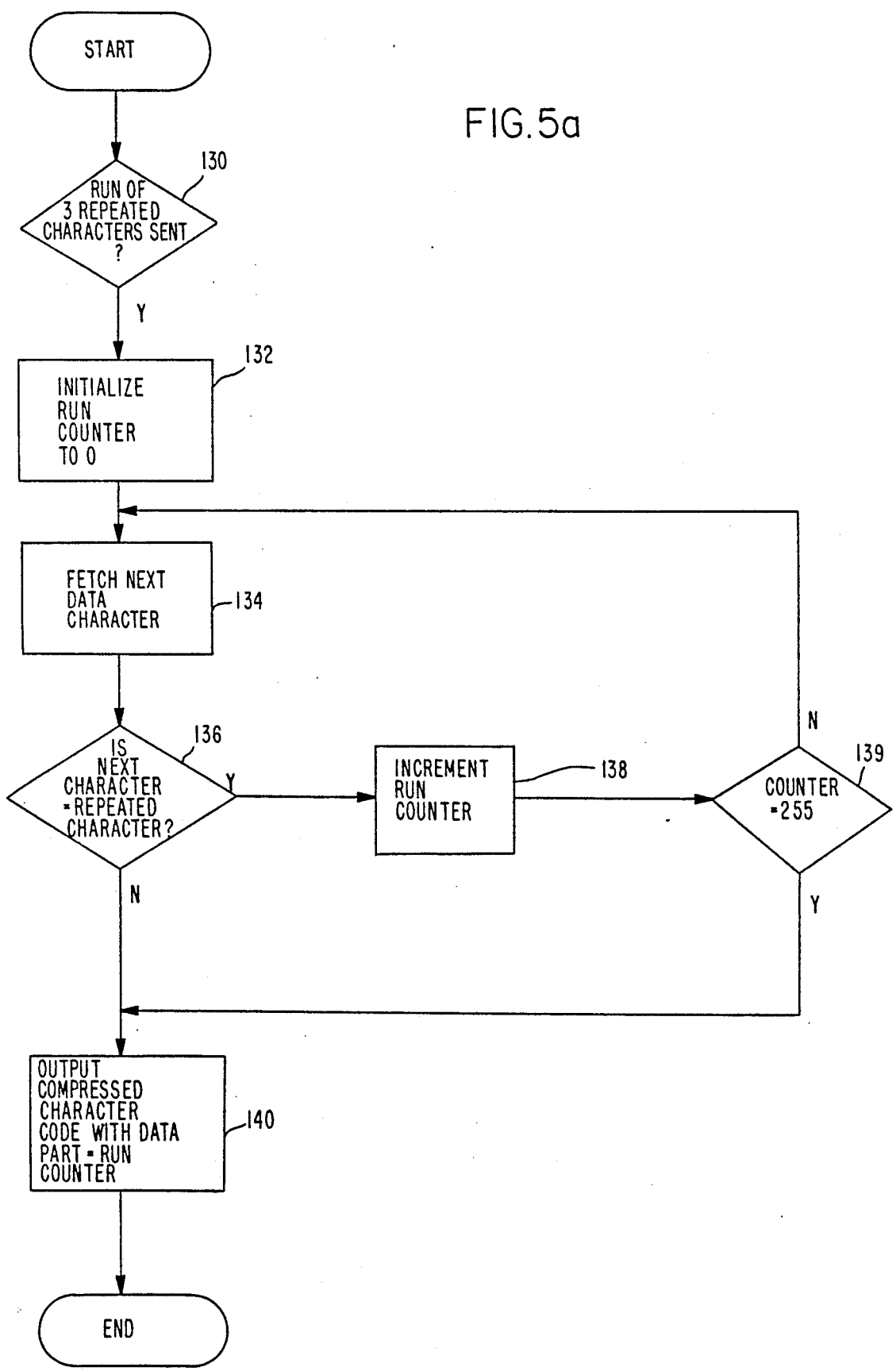
FIGS. 5(a) and 5(b) is a flow diagram of the procedure utilized by the compressing and decompressing modem, respectively, of the present invention to recognize runs of repeated characters.
Figure 5B:
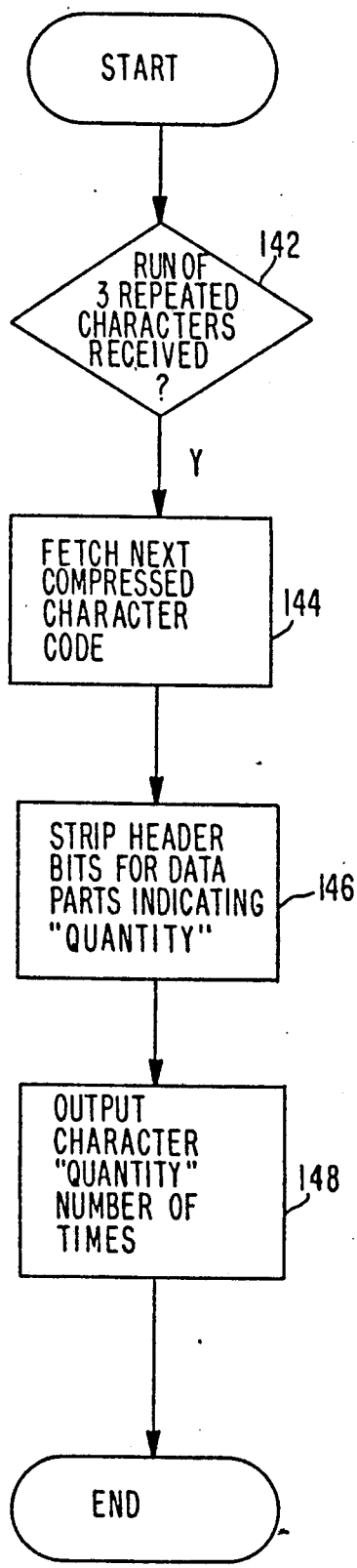

Referring to FIGS. 5(*a*) and 5(*b*), the efficiency of the compressor can be further increased by removing repeated characters. Runs of the same character are removed from the data stream and a token counter is transmitted in its place. In order to avoid the creation of token codes which take up space in the data stream, the compressor of the present invention utilizes the pre-existing codes in a different manner. Statistically, the average length of a run of repeats is two characters. If more than two characters appear, the first three of the characters are processed in the normal compressed manner as described above. The characters after the first three repeated characters are not transmitted, but instead are counted without incrementing the frequency table. Specifically, after a run of 3 characters is detected in step 130, a run counter is initialized to 0 in step 132. The next data character is fetched in step 134, and if this next data character is the same as the repeated character, step 136 causes the run counter to be incremented in step 138 and control returns to step 134 to fetch the next data character.

Once a different character is input to the compressor or the counter reaches the number of compressed codes available as tested in step 139, the run of repeated characters has ceased and the compressor sends the compressed character code corresponding to the length of the run of the characters minus three in step 140.

At the receiving modem 13, the decompressor processes the string of characters in exactly the reverse order. The decompressor checks for strings of three repeated characters in step 142, and when such a string is found, the decompressor then utilizes the next compressed character code fetched in step 144 for its actual numeric value, and instead of outputting that character it outputs the previous character the number of times represented by the numeric value of the data part in step 148. The efficiency of such a system is directly proportional to the length of the run of characters. In other words, if the run characters is three characters long, the system loses efficiency because the system has to send the zero character token after the initial three characters in a run go through. If the run is four characters long, the system breaks even since there are still only four characters. The true savings results when the run of repeated characters is longer than four characters. In most data packages, there are more three character runs than longer runs, but the advantage gained by the longer runs far outweighs the loss from the three-character runs.

In order to effectively make use of such a compressor in a modem 11, several additional tokens of information must be communicated from the initiating modem (compressor) 11 to the receiving modem (decompressor) 13. Bitflush tokens are sent whenever the initiating modem runs out of data in its input stream. The compressor must first check if this happens at the end of a run of repeats, and if so, the compressor sends the current repeat counter and resets the counter. Then, the compressor must flush and send the bits that it holds, and these remaining bits must be sent in byte-size packages. In order to create the byte-size packages, the compressor appends the flush token to the leftover bits, and pads this with zeros to make an intergral number of bytes. The compressor then sends this byte-size package and continues operation in the non-compressing mode.

When the decompressor reads the flush token, it then flushes the padded bits it has read and operation continues in the receiving modem under a non-decompressed mode. Because of this pseudo-synchronous nature of this system, both the initiating modem 11 and the receiving modem 13 must enter and leave the compressed mode in sequence. Operation under the compression mode will also cease, in a similar manner to when the input data stream runs out, when the initiating modem receives instructions to exit the compression mode. When such an exit instruction is received by initiating modem 11, the compressor executes the bitflush procedure described above to send the remaining bits to the receiver. The compressor then sends the exit token to the receiving modem 13 and starts sending data uncompressed. When the receiving modem 13 senses the exit token, it ceases decompressing and passes the data directly.

The bitflush tokens as well as other tokens can be represented by adding bits to the end of the 256th character (most infrequent character). Therefore, instead of 1111111111 being the most infrequent character, 11111111111 is the most infrequent character and 11111111110 is a token. This can be done indefinitely creating $2^x$ tokens if x bits are added to the end of the first token. While creating these tokens decreases the efficiency of the algorithm slightly, the efficiency is lost only when the most infrequent character occurs, and by definition this occurs infrequently.

The data compressing modems of the present invention enhance any data telecommunications system. These compressing modems provide several benefits over and above the decrease in data length. First, the compressing process allows for expansion to include extra tokens and a greater number of characters. Second, the compressed data from the initiating modem includes its own length information thereby eliminating the need for extra information for determining the beginning and ending of each code. Thirdly, the compressing modems use a fixed number of resources which can be determined at start-up time. Finally, and most importantly, the speed at which data can be transmitted will far exceed the normal transmission speed of the connected modems.

While the foregoing invention has been described with reference to its preferred embodiments, variations and modifications will occur to those skilled in the art. All such variations and modifications are intended to fall within the scope of the appended claims.

What is claimed is:

1. Apparatus for transmitting data in a compressed form between an initiating unit of data terminal equipment and a receiving unit of data terminal equipment connected over communications lines, one of said units having a compressing modem connected between said unit and telephone lines, and the other of said units having a decompressing modem connected between said other unit and telephone lines, said apparatus comprising:
   (a) means for fetching a next data character from a data stream to be sent over communication lines;
   (b) means for transmitting a compressed character code assigned to said next data character to the decompressing modem;
   (c) means for incrementing a relative frequency counter for said next data character;
   (d) means for comparing said relative frequency counter for said next data character to a relative frequency counter of a next more frequently occurring character;
   (e) means for determining whether the relative frequency of said next data character is greater than the relative frequency of said next more frequently occurring character, and, if so, means for exchanging the compressed character codes assigned to said next data character and to said next more frequently occurring character;
   (f) means for repeating the operations of means (d) through (e) until the relative frequency of said next data character is less than the relative frequency of said next more frequently occurring character or said next data character is the most frequent character; and
   (g) means for repeating the operations of means (a) through (f) for next data characters and for transmitting said compressed character codes to said decompressing modem.

2. The apparatus for transmitting data in a compressed form of claim 1 further comprising:
   (a) means for fetching a next transmitted compressed character code;
   (b) means for determining a data character assigned to said next compressed character code;
   (c) means for incrementing a relative frequency counter for said determined data character;
   (d) means for comparing said relative frequency counter for said data character to a relative frequency counter for a next more frequently occurring data character;
   (e) means for determining whether the relative frequency of said data character is greater than the relative frequency of said next more frequently occurring data character, and, if so, means for exchanging said compressed character codes to which said data character and said next more frequently occurring data character are assigned;
   (f) means for repeating the operations of means (d) through (e) until the relative frequency of said data character is less than the relative frequency of said next more frequently occurring data character or said data character is the most frequent; and
   (g) means for repeating the operations of means (a) through (f) for compressed character codes transmitted to said decompressing modem.

3. The apparatus of claim 1 wherein said compressed character codes are assigned to data characters so that the nth shortest character code is assigned to the nth most frequently occurring data character.

4. The apparatus of claim 1 further comprising:
   (a) means for comparing said relative frequency of said next data character to a preset limit; and
   (b) means for dividing a relative frequency count of each data character by 2 when said relative frequency of said next data character is greater than said preset limit.

5. The apparatus of claim 1 further comprising:
   (a) means for detecting a run of next repeated data characters in said data stream; and
   (b) means for transmitting said repeated character and a representation of the number of occurrences in said run of said repeated character.

6. The apparatus of claim 5, wherein said representation is one of said compressed character codes assigned to said data characters.

7. The apparatus of claim 1 herein said compression code has a length indicating header part and a data part and wherein said header part comprises three bits and said data part comprises at least one bit.

8. The apparatus of claim 1 further including memory means for storing a count of the relative frequency of each data character and wherein said memory means comprises a table in a memory storage device, each location in said table corresponding to a unique one of said data characters.

9. The data telecommunications system of claim 1 including memory means for storing a unique compressed character code for each charcter and wherein said memory means comprises a table in a memory storage unit, each location in said table including a unique compressed character code.

* * * * *